United States Patent [19]

Kanaya et al.

[11] Patent Number: 5,087,156
[45] Date of Patent: Feb. 11, 1992

[54] PRINTED CIRCUIT BOARD BORING MACHINE

[75] Inventors: Yasuhiko Kanaya, Machida; Tamio Otani, Hadano; Kunio Arai, Atsugi, all of Japan

[73] Assignee: Hitachi Seiko Ltd., Japan

[21] Appl. No.: 620,020

[22] Filed: Nov. 30, 1990

[51] Int. Cl.⁵ .................................................. B23B 35/00
[52] U.S. Cl. .............................. 408/1 R; 408/241 R; 408/95; 408/97; 408/68; 408/61
[58] Field of Search ................. 408/1 R, 3, 241 R, 67, 408/72 B, 95–98, 241 B, 51, 76, 4, 61, 68

[56] References Cited

U.S. PATENT DOCUMENTS

| | | | |
|---|---|---|---|
| 1,219,190 | 3/1917 | Symes | 408/76 |
| 1,946,214 | 2/1934 | Kabiating | 408/76 |
| 2,669,889 | 2/1954 | Huller | 408/72 B X |
| 3,663,114 | 5/1972 | Welsh et al. | 408/3 |
| 4,037,982 | 7/1977 | Clement | 408/61 |
| 4,280,775 | 7/1981 | Wood | 408/51 X |
| 4,596,067 | 6/1986 | Raiteri | 408/3 X |
| 4,596,500 | 6/1986 | Raiteri | 408/67 X |
| 4,605,344 | 8/1986 | Hartmann | 408/95 |
| 4,761,876 | 8/1988 | Kosmowshi | 408/76 X |
| 4,813,825 | 3/1989 | Kosmowshi | 408/67 X |
| 4,872,787 | 10/1989 | Arai et al. | 408/95 |
| 4,915,550 | 4/1990 | Arai et al. | 408/61 X |
| 4,917,547 | 4/1990 | Frederickson et al. | 408/61 X |
| 4,997,319 | 3/1991 | Arai et al. | 408/95 X |
| 5,024,562 | 6/1991 | Arai et al. | 408/67 X |

FOREIGN PATENT DOCUMENTS 110510  6/1984  Japan .................. 408/1 R

Primary Examiner—Larry I. Schwartz
Assistant Examiner—Robert Schultz
Attorney, Agent, or Firm—Evenson, Wands, Edwards, Lenahan & McKeown

[57] ABSTRACT

A printed circuit board boring machine bores printed circuit boards stacked on a table, by a drill while pressing the printed circuit boards with a pressure foot. A piece having a hole through which the drill may pass is detachably mounted on a tip end portion of the pressure foot with a center of the hole being aligned with an axis of the drill. The piece may be attached to the pressure foot before the boring work so that the boards and the piece may be simultaneously bored by the drill while the hole in the piece may be used as a guide for the boring work of the boards.

11 Claims, 10 Drawing Sheets

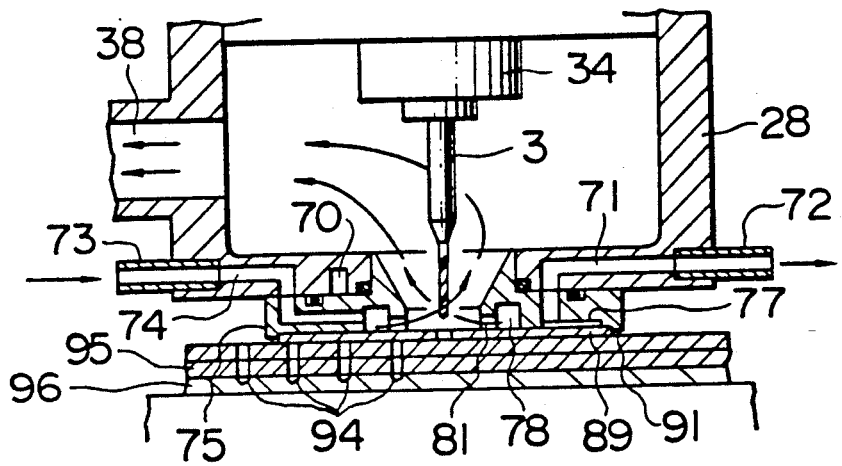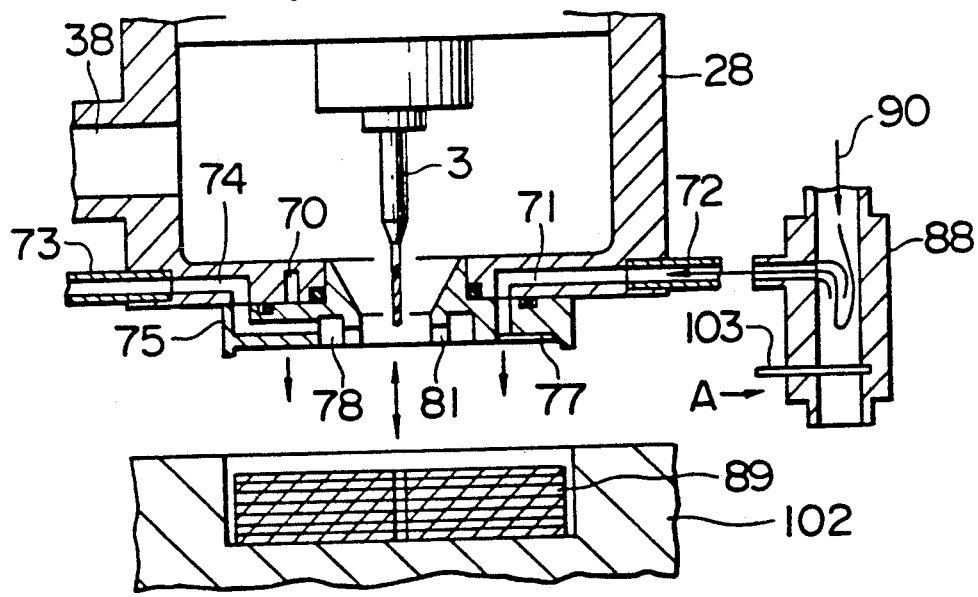

PRINTED CIRCUIT BOARD BORING MACHINE

BACKGROUND OF THE INVENTION

The present invention relates to a printed circuit board boring machine, and more particularly to a machine for boring printed circuit boards by using a drill.

In general, a printed circuit board boring machine is constructed as shown in FIG. 18, which comprises a bed 1 and a table 2 slidably supported on the bed 17 and driven by a drive apparatus (not shown). Drills 3 are prepared in holders 4 fixed to the table 2. A column 5 is provided on the bed 1 so as to straddle the table 2. A spindle carriage 6 is slidably supported to the column 5 and is driven by an action of a Y-axis drive motor 7. A spindle saddle 8 is slidably supported on the spindle carriage 6 and is driven by an action of a Z-axis drive motor 9. Each spindle 10 (FIG. 19) is supported on the spindle saddle 8 and is drivingly rotated by an action of an associated motor 11. A pressure foot 12 is mounted on a cylinder block 13. Reference character W denotes printed circuit boards (hereinafter referred to as boards). The boards W are mounted on the table 2 by standard pins P. The table 2 and the spindle carriage 6 are moved in X- and Y-directions, to thereby locate the printed circuit boards W and the spindles 10 in place. Thereafter, the spindles 10 are moved in the Z-direction to thereby perform the boring work with the drill 3 held at the associated spindles 10.

FIG. 19 shows a structure of the boring portion including a pressure foot 12'.

A spindle 10 and air cylinders 22 are accommodated in the spindle saddle 8. The pressure foot 12' is arranged at the tip ends of the air cylinder 22. With such an arrangement, the printed circuit boards W are located in place by the spindle carriage 6 and the table 2. Thereafter, the spindle saddle 8 is lowered so that the pressure foot 12' depresses a contact plate 17. Then, the spindle 10 is advanced to thereby perform the boring work on the printed circuit boards W. The contact plate 17 is laid on the uppermost board W, and a bottom plate 16 is laid under the lowermost board W. The bottom plate 16 is used for the purpose of preventing the drill 40 from boring the table 2. The contact plate 17 is used for the purposes of enhancing the initial fitting operation of the drill 40 and preventing burrs from being generated upon the drill removal. In general, the contact plate is made of aluminum with a thickness of 0.15 mm to 0.2 mm.

FIG. 20 shows another structure of the spindle portion of the printed circuit board boring machine. In FIG. 20, numeral 29 denotes a cylinder fixed on the spindle saddle 8. An interior of the cylinder 29 is in fluid communication with a compressed air source through a pipe 32. A bearing 33 is engaged with the cylinder 29 to rotatably support the spindle 10. A chuck 34 is fixed to a lower end of the spindle 10 for holding a drill 3. The pressure foot 12 is fixed to the lower end of a piston 35. A discharge port 38 connected to a vacuum suction is formed on a side wall of the pressure foot 12. Grooves for suction of the air during the boring work are formed at a bottom end portion of the pressure foot 12.

The spindle portion shown in FIG. 19 is structured so that an inner diameter D1 of the board pressing portion 30 of the pressure foot 12' is larger than a maximum outer diameter D2 of a drill 40 as shown in FIG. 19. For this reason, in the case of a small diameter drill 3 is used as shown in FIG. 21, the pressure foot 12' presses the boards W at a remote position by a distance L1 from the boring portion of the drill 3. Thus, the drill is likely to be broken.

When the drills are pulled out from the boards W, undesired burrs are formed on the upper side of the printed circuit boards W, so that the boards W are faulty. In order to prevent the generation of burrs upon the pulling-out of the drill, it is necessary to lay the contact plate on the uppermost board W every time when the boards W are to be replaced. In addition, the contact plate 17 can be used only once and thrown away. This is economically disadvantageous.

In the spindle portion shown in FIG. 20, the compressed air having a predetermined pressure is supplied to the cylinder 29 and the piston 35 is moved downwardly. When the spindle saddle 8 shown in FIG. 18 is lowered, the pressure foot 12 presses the boards W as shown in FIG. 22. Thereafter the drill 3 is pushed into the printed circuit boards W to perform the boring work. At this time, the air is sucked into the pressure foot 12 through the grooves 39. Then, the air is discharged from the discharge port 38. Cut chips or powders are discharged from the discharge port 38 and the cooling of the drill 3 is effected by the air sucked through the grooves 39. Also, when the drill 3 is pulled out from the boards W, the burrs are generated on the upper side of the printed circuit boards W, so that the boards are faulty. Therefore, also in this printed circuit board boring machine, the contact plate 17 is laid on the uppermost board W, and the boards are depressed through the contact plate 17 by the pressure foot 12' to prevent the lift or vibration of the printed circuit boards during the boring work to ensure the boring quality and to prevent the damage of the drill. The contact plate 17 suffers from an economical problem such that it is necessary to replace the contact plate with a new one whenever the printed circuit boards W are replaced and the previously used one must be scrapped.

In view of the foregoing defects and difficulties inherent in the conventional machines, an object of the invention is to provide a printed circuit board boring machine which may depress the vicinity of the drill bores in the printed circuit boards in a constant manner irrespective of the diameter of the drills without using the contact plate to be laid on the uppermost board during the boring work of the printed circuit boards, and which may perform the boring work of the printed circuit boards without fail and without any burr in the printed circuit boards.

SUMMARY OF THE INVENTION

In order to attain the foregoing and other objects of the invention, there is provided a printed circuit board boring machine for boring printed circuit boards stacked on a table by a drill while pressing the printed circuit boards by a pressure foot, characterized in that a piece having a hole through which the drill may pass is detachably mounted on a tip end portion of the pressure foot with a center of the hole being aligned with an axis of said drill.

According to another aspect of the invention, there is provided a printed circuit board boring machine for boring printed circuit boards stacked on a table by a drill while pressing the printed circuit boards by a pressure foot, characterized in that a piece on which a hole for guiding the drill during a boring work of the printed circuit boards is to be worked after mounting is detachably mounted on a tip end portion of the pressure foot.

In accordance with a further aspect of the invention, there is provided a printed circuit board boring machine for boring printed circuit boards stacked on a table while pressing the printed circuit boards by a pressure foot, characterized in that a piece for depressing the printed circuit boards in place is detachably mounted on a tip end portion of the pressure foot, and further comprising a piece receiver for supplying a plurality of pieces one by one and a piece disposer for disposing used pieces, the piece receiver and the piece disposer are mounted on the table.

The machine further comprises a piece temporary locater for temporarily removing and locating the piece at the time of drill replacement. The temporary locater is provided on the table.

The table on which the piece receiver and the piece disposer are laid is a table on which the printed circuit boards are laid.

The boring work for boring the hole for guiding the drill during the boring work is performed simultaneous with the boring of the printed circuit boards.

The lower surface of the piece is formed to be planar.

The piece is made of magnetic material, and magnets are provided at a prescribed location of the tip end portion of the pressure foot whereby the piece is held in place by a magnetic force of the magnets.

According to still another aspect of the invention, there is provided a printed circuit board boring machine for boring printed circuit board by a pressure foot supported to be slidable in an axial direction of a spindle, connected to a vacuum suction source and adapted to depress the printed circuit boards during a boring work. The machine comprises a pad having a plurality of air blow-out ports for ejecting air, supplied from an air supply port formed in a side wall of the pressure foot, toward an opening interior of the pressure foot, an air supply passage connected to the air supply port and terminating at the plurality of air blow-out ports, a plurality of air suction ports formed in a contact face with the printed circuit boards, and an air suction passage extending from the plurality of air suction ports to an air discharge port formed in the side wall of the pressure foot. The pad is mounted on a tip end portion of the pressure foot, and a plate-like member is detachably mounted on the contact surface of the pad with the printed circuit boards by a suction force of the plurality of air suction ports.

The plurality of air blow-out ports for ejecting the air to the opening interior of the pressure foot are directed to tangential directions of the drill supported to the spindle.

An orifice-like nozzle is formed within the air supply passage.

Guides having a depth smaller than a thickness of the plate-like member are provided on the contact face of the pad with the printed circuit boards.

The piece is detachably mounted on the tip end portion of the pressure foot. One printed circuit board or a plurality of stacked boards are depressed by the piece to perform the boring work from above the piece. The piece mounted on the pressure foot is moved together with the pressure foot. Namely, the pressure foot having the piece at the tip end is lowered by the action of the pneumatic cylinders, so that the printed circuit boards laid on the table are depressed directly by the piece. Thereafter the drill is lowered to form a predetermined hole in the printed circuit board through the piece. Thereafter, the pneumatic cylinders are actuated to raise the piece together with the pressure foot. The next work operation is attained by a similar procedure.

Thus, the piece is detachably mounted on the tip end portion of the pressure foot, and the printed circuit boards are directly depressed by the piece. As a result, it is possible to depress the portion in the vicinity of the drilled bore at all times without using the contact plate on the uppermost board during the boring work on the printed circuit board irrespective of the size of the diameter of the drill, and to perform the boring work on the printed circuit boards without any burr generation.

Furthermore, since the piece to depress the boards is detachably mounted on the tip end portion of the pressure foot and the piece receiving means for supplying a plurality of pieces one by one and the piece disposing means for disposing the used pieces are mounted on the table, it is possible to always depress the vicinity of the board portion of the printed circuit boards to be drilled irrespective of the diameter of the drill without using the contact plate to be laid on the uppermost board during the boring work of the boards and to prevent the burrs from being generated. It is thus possible to more effectively perform the boring work of the printed circuit boards. In addition, it is possible to continuously and automatically perform the attachment/detachment of the piece.

Also, since the piece temporary locator for temporarily locating the piece during the drill replacement is provided on the table, it is possible to prevent the waste disposal of the pieces during the drill replacement.

The table on which the mounted piece receiver, the piece disposer and the piece temporary locater may be used also as the table on which the printed circuit boards are laid, whereby it is possible to shorten a distance of movement of the pressure foot, and it is possible to make the attachment/detachment of the pieces and the drills automatic.

Furthermore, in order to work a hole for guiding the drill during the boring work of the printed circuit boards, the piece is detachably mounted just below the tip end portion of the printed circuit board pressing device to thereby simultaneously work the piece and the printed circuit boards. Accordingly, in the case where the small diameter drill is replaced by the large diameter drill, it is possible to use the piece once more, which is economically advantageous.

Since the lower surface of the piece is planar, there is no fear that the surface of the boards would be damaged when the boards are depressed by the lower surface of the piece.

Since the piece may be made of magnetic material and the magnets may be provided at predetermined locations of the tip end portion of the pressure to hold the piece by the magnetic force of the magnet, it is possible to dispense with the vacuum pressure generator.

The pad having a plurality of air blow-out ports for ejecting air, supplied from an air supply port formed in a side wall of the pressure foot, toward an opening interior of the pressure foot, an air supply passage connected to the air supply port and terminating at the plurality of air blow-out ports, a plurality of air suction ports formed in a contact face with the printed circuit boards, and an air suction passage extending from the plurality of air suction ports to an air discharge port formed in the side wall of the pressure foot is mounted on a tip end portion of the pressure foot. A plate-like member is detachably mounted on the contact surface of the pad with the printed circuit boards by a suction force of the plurality of air suction ports. It is therefore possible to depress the vicinity of the board portion of the boards to be drilled at all times irrespective of the diameter of the drills without using the contact plate laid on the uppermost board during the boring work of the printed circuit boards and to perform the boring work without fail and without generation of burrs on the printed circuit boards. It is thus possible to cool down the drill and to remove cut chips.

Since the plurality air blow-out ports for ejecting the air toward the opening interior of the pressure foot are provided in tangential directions of the circumference of the drill supported by the spindle, it is possible to positively cool down the drill and to remove the cut chips.

Since the orifice-like nozzle is provided within the air supply passage, it is possible to more effectively ensure the cooling of the drill.

Furthermore, since the guide having a depth smaller than a thickness of the plate-like member is provided on the contact surface of the pad with the printed circuit boards, it is possible to prevent a displacement or offset of the mounted position of the plate-like member during the boring work by the drill.

BRIEF DESCRIPTION OF THE DRAWINGS

In the accompanying drawings:

FIGS. 12 to 16 show a series of operations of the printed circuit board boring machine shown in FIG. 8;

DESCRIPTION OF THE PREFERRED EMBODIMENTS

Figure 1:
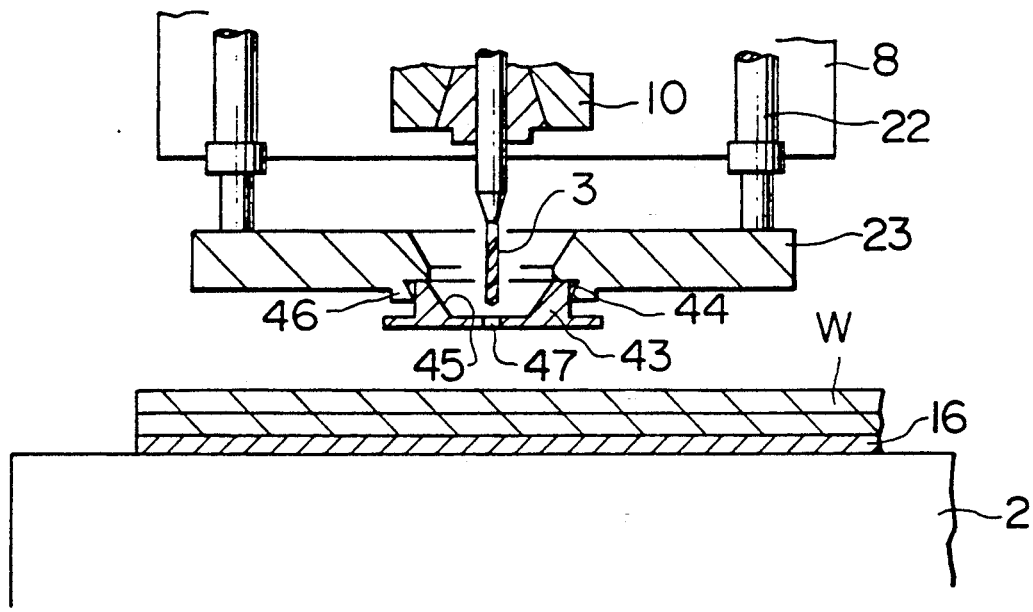
FIGS. 1 and 2 are side cross-sectional views showing a printed circuit board boring machine in accordance with a first embodiment of the invention.
Figure 2:
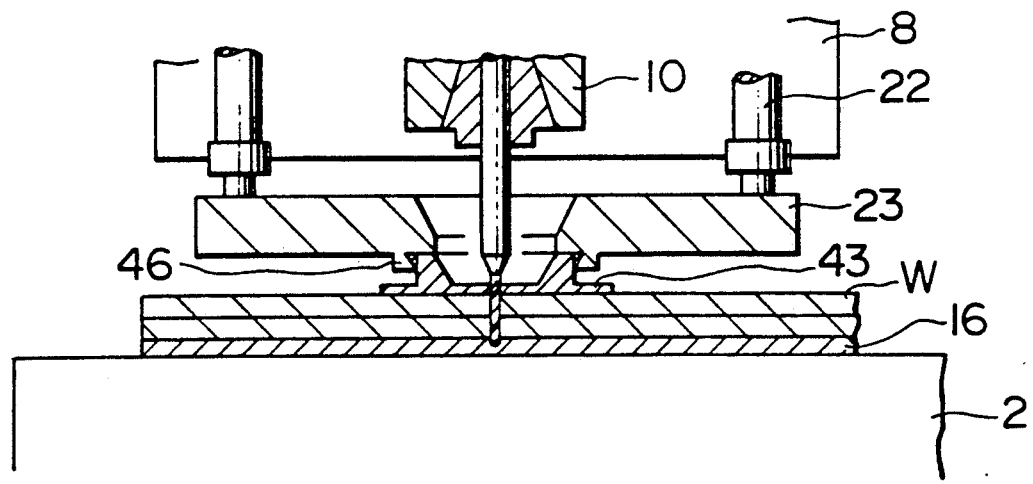

FIGS. 1 and 2 show a first embodiment of a printed circuit board boring machine according to the invention. A piece 43 is detachably mounted on a tip end portion of a pressure foot 23. The piece 43 is moulded of a plastic and is pressingly fitted in an engagement portion 46 of the pressure foot 23 by utilizing a projection 44 which forms a part of the piece 43. The piece 43 is provided at its inside with a conical portion 45 so that a pressure force for printed circuit boards 15 by pneumatic cylinders 22 are concentrated on the vicinity of a drill 3 through the pressure foot 23. A through hole 47 having substantially the same diameter as that of the drill 3 is formed at a position which is identical with an axial center of the drill 3 in the central portion of the piece 43. The drill 3 is slidably fitted through the hole 47.

Also, the printed circuit boards W are disposed on a lower plate 16. A conventional contact plate 17 is not laid on an uppermost layer of the printed circuit boards W.

With such an arrangement, when the spindle saddle 8 is lowered as shown in FIG. 2, the piece 43 mounted on the tip end face of the pressure foot 23 depresses the printed circuit boards W to hold the printed circuit boards W. Accordingly, the piece 43 serves as the conventional contact plate. Under such a condition that the piece 43 is overlapped on the printed circuit boards W, the drill 3 is lowered to thereby work the printed circuit boards W.

According to this embodiment, the through hole is formed in advance in the central portion of the piece 43. It is, however, possible to form the piece 43 of plastic and to lower the drill 3 under the condition that the piece 43 is overlapped on the printed circuit boards W, to thereby work the piece 43 as well as the printed circuit boards W for forming the through hole 47.

More specifically, when the spindle saddle 8 is lowered, the piece 43 mounted on the pressure foot 23 depresses the printed circuit boards W. Under this condition, the piece 43 serves as a conventional contact plate. Thus, the piece 43 and the printed circuit boards W are worked together under the condition that the piece 43 is overlapped on the printed circuit boards W. Subsequent boring operation is continued by using the hole, formed in the piece 43, as a guide hole.

Figure 3:
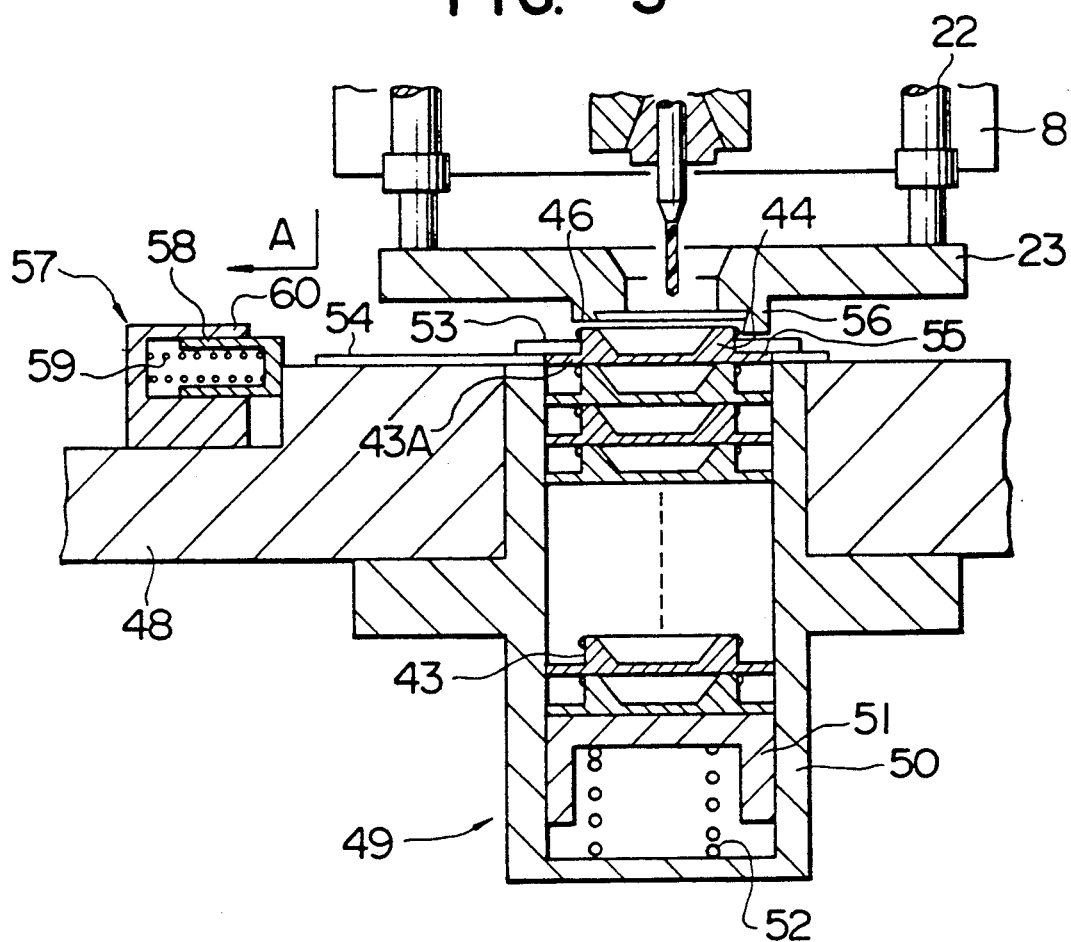
FIG. 3 is a side sectional view showing a printed circuit board printing machine in accordance with a second embodiment of the invention.
Figure 4:
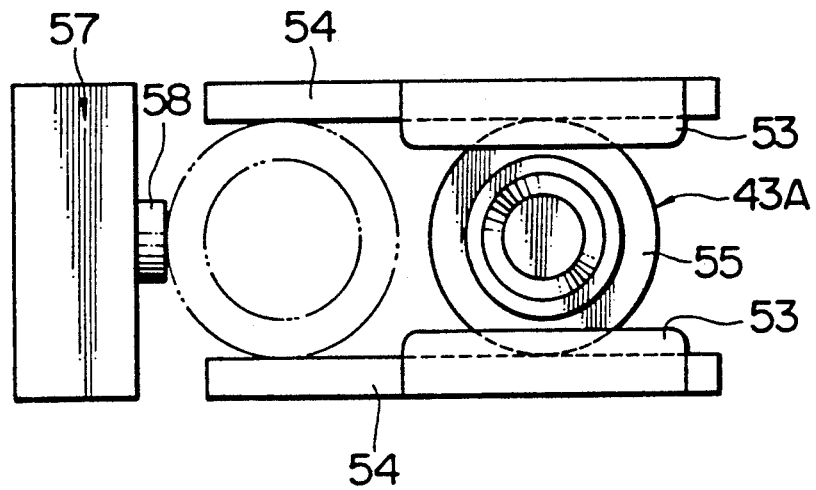
FIG. 4 is a plan view showing a piece receiving means shown in FIG. 3.

FIGS. 3 and 4 show a printed circuit board boring machine according to a second embodiment of the invention in which a piece receiving device 49 is mounted on a table 48. The piece receiving device 49 is adapted to receive a plurality of pieces 43 in a holder 50. The pieces 43 are pushed upwardly by a ring 51 and a spring 52. As better shown in FIG. 4, the uppermost piece 43A is supported by stoppers 53 for limiting the upward movement and guides 54 for guiding an outer circumferential portion of a flange 55 of the uppermost piece 43A on both sides.

A projection 56 is formed at a tip end of the pressure foot 23 for expelling the uppermost piece 43A from the holder 50 of the piece receiving device 49. A piece positioning device 57 is composed of a cushion stopper 58 having a U-shape in cross section, a spring 59 installed within the cushion stopper 58, and a holder 60 slidably fitted in the cushion stopper 58.

With such an arrangement, when the spindle saddle 8 is lowered and then moved leftward in FIG. 3, the projection 56 formed on the pressure foot 23 presses a projection 44 formed on the piece 43 in a direction indicated by arrow A, to thereby expell the uppermost piece 43 away from the holder 50 of the piece receiving device 49. Thereafter, the expelled uppermost piece 43 is guided and slid on the table 48 by the guides 54. The piece 43 then comes into contact with the cushion stopper 58 having therein the spring 59, for locating. After located, the spindle saddle 8 is further lowered so that the piece 43 is pressingly inserted into the engagement portion 46 of the pressure foot 23.

Figure 5:
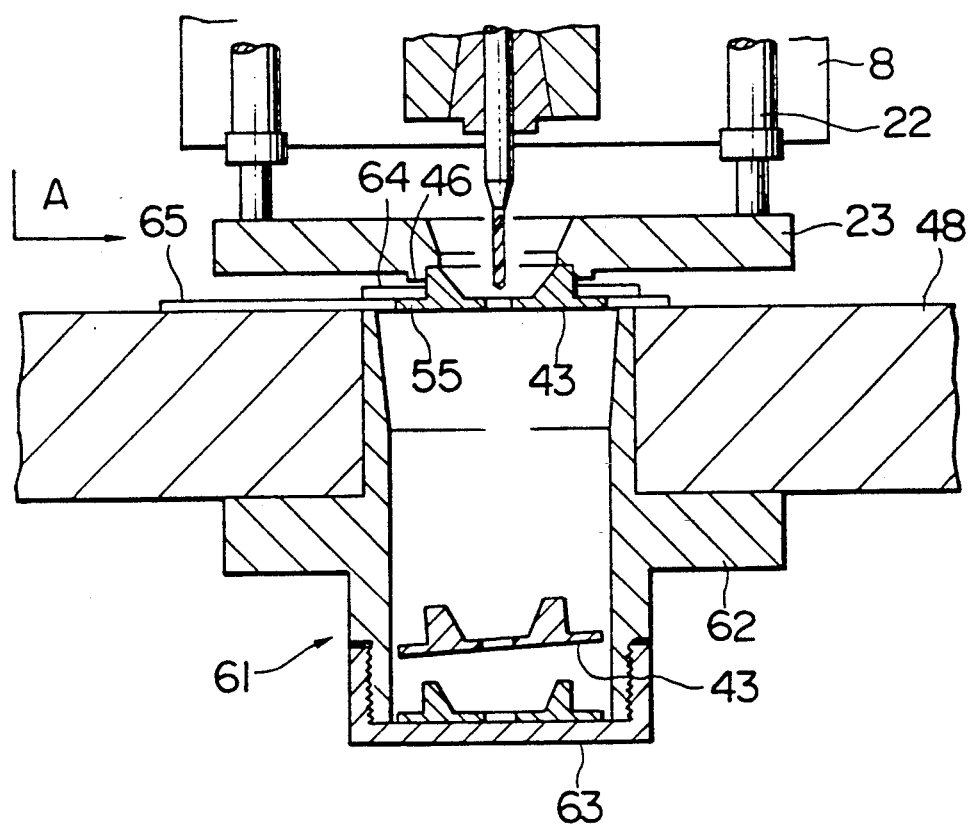
FIG. 5 is a side sectional view showing a printed circuit board boring machine in accordance with a third embodiment of the invention.

FIG. 5 shows a printed circuit board boring machine according to a third embodiment of the invention, in which a piece disposer 61 is mounted on a table 48. The piece disposer 61 is composed of a casing 62 and a cover 63. In the same manner as the piece receiver 49 shown in FIG. 4, stoppers 64 and guides 65 are formed at an upper end of the casing 62. The stoppers 64 serve to hold the flange 55 of the piece 43 on both sides in order to prevent the piece 43 from moving upward together with the pressure foot 23 when the pressure foot 23 is raised upwardly and the piece 43 is pulled out from the pressure foot 23. The guides 65 function to guide the outer periphery of the flange 55 so that the piece 43 is smoothly engaged with the stoppers 64 when the spindle saddle 8 is moved rightward in FIG. 5.

With such an arrangement, the piece 43 pressingly engaged with the engagement portion 46 of the pressure foot 23 is disposed when the spindle saddle 8 is moved in a direction as indicated by the arrow A in FIG. 5, which is opposite to the arrow in FIG. 3 where the piece is to be loaded on the pressure foot 23.

Figure 6:
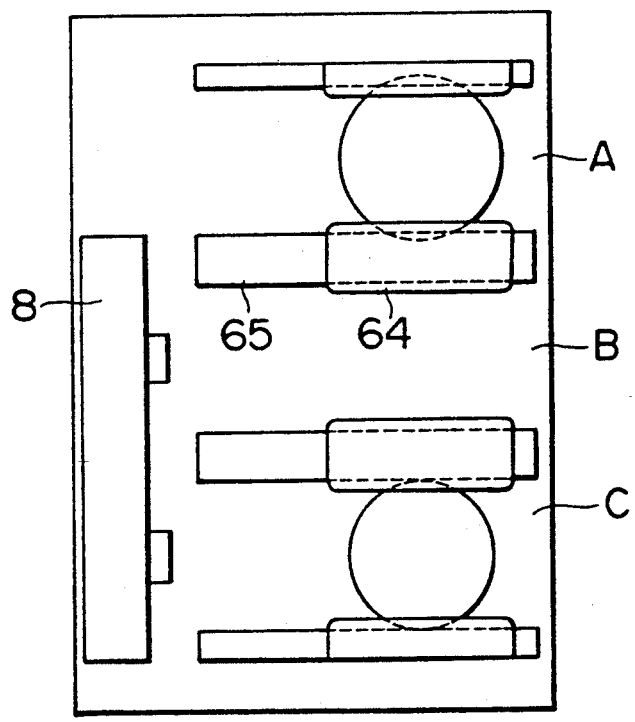
FIG. 6 is a plan view showing a printed circuit board boring machine in accordance with a fourth embodiment of the invention.

FIG. 6 shows a printed circuit board boring machine according to a fourth embodiment of the invention, in which a piece receiver A shown in FIG. 3, a piece temporary locator B and a piece disposer C shown in FIG. 5 are accommodated in the table 48.

In the printed circuit board boring machine, the drill replacing operation is generally automatically performed by an automatic drill replacing device (not shown) on the table 2. In the case where the piece is temporarily removed for the sake of the drill replacement or the like, the piece temporary locator is utilized. More specifically, the temporary locator has the stoppers 64 and the guides 65 but it does not comprise a member like the holder 50 and the casing 62.

In case of the temporary location of the piece, when a diameter of a drill to be used is larger than that of the drill used before the temporary location, the piece used before may be again mounted on the pressure foot, so that the piece may be worked together with the printed circuit boards W for a new hole working.

The table 48 in which installed are the piece receiver A, the piece temporary locator B and the piece disposer C may be used as a table on which the printed circuit boards W are stacked.

Figure 7:
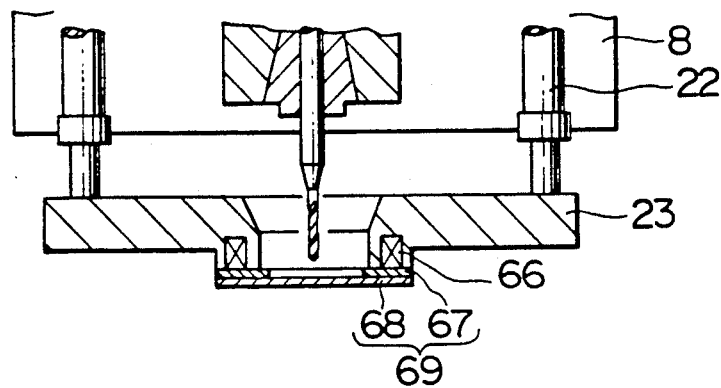
FIG. 7 is a side sectional view showing a printed circuit board boring machine in accordance with a fifth embodiment of the invention.

FIG. 7 shows a printed circuit board boring machine in accordance with a fifth embodiment of the invention, in which magnets 66 are accommodated in the tip end portion of the pressure foot 23. A magnetic member 67 (for example, iron member) is bonded to a plastic plate 68. A piece 69 is composed of the magnetic member 67 and the plastic plate 68.

If a vacuum suction device is provided at the tip end of the pressure foot 23, it is possible to suck the piece made in the form of a disk in a vacuum suction-line manner.

Figure 8:
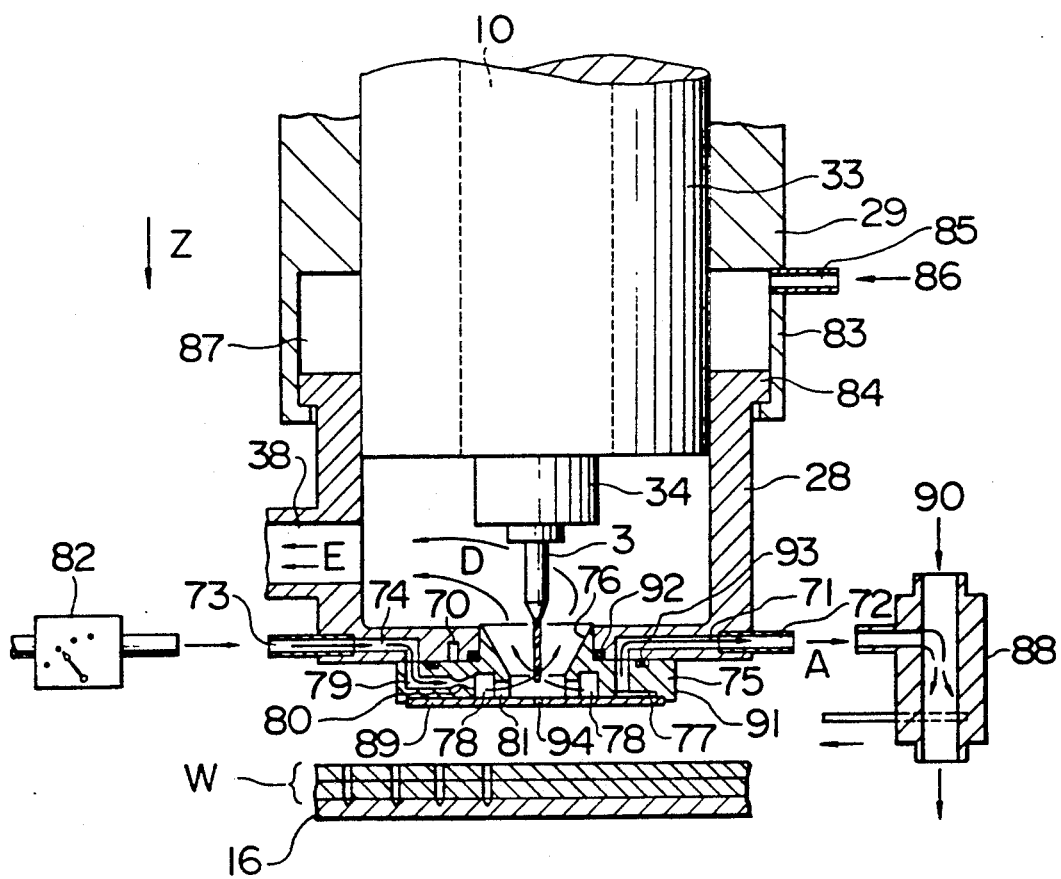
FIG. 8 is a side sectional view showing a printed circuit board boring machine in accordance with a sixth embodiment of the invention.

FIGS. 8 to 17 show a printed circuit board boring machine in accordance with a sixth embodiment of the invention, in which a bearing 33 rotatably holds a spindle 10 therein. A chuck 34 is fixed to the spindle 10 for holding a drill 3. A pressure foot 28 slidably engages with the bearing 33. A discharge port 38 is formed on a side wall of the pressure foot 28 for discharging air and cut powder or chip within the pressure foot 28 and is connected to a dust collector (not shown) through a hose or the like (not shown). An annular passage 70 is formed in the tip end face of the pressure foot 28. A gas suction passage 71 is directed radially toward the outer side wall of the pressure foot 28 and connected to the annular passage 70. A suction port 72 is connected to the gas suction passage 71. A supply port 73 is formed on the side wall of the pressure foot 28. A gas supply passage 74 is formed toward the center from the supply port 73. The gas supply passage 74 as formed in an L-shape toward the end face of the pressure foot 28 is shown in FIG. 8 and is opened at the end face of the pressure foot 28.

Figure 11:
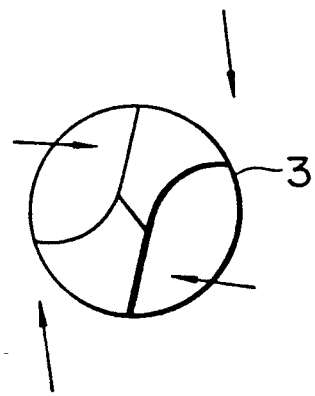
FIG. 11 is an enlarged bottom view showing a drill for illustrating the relationship between the drill and air flow shown in FIG. 8.

A pad 75 is coupled with the pressure foot 28 at an engagement portion 76, and is fixed to a lower surface of the pressure foot 28. The gas suction passage 71 is connected to the pad 75. The pad 75 is provided with a plurality of radially extending cavities 77. An annular passage 78 is formed in the pad 75. A passage 79 is connected to the annular passage 78. An orifice-like nozzle 80 is formed in the passage 79. An air suction passage is formed by the cavities 77, the annular passage 70 and the gas suction passage 71. An air supply passage is formed by the gas supply passage 74, the passage 79 and the annular passage 78. A plurality of air blow-out ports 81 opened to an inner portion of the lower end portion of the pressure foot 28 is formed so that the air is blown along the drill grooves of the drill 3 as shown in FIG. 11.

A flow rate adjustable type high pressure air supply device 82 is used for supplying high pressure air to the supply port 73. Reference numeral 83 denotes a cylinder. Reference numeral 84 denotes a piston of the pressure foot 28. Reference numeral 85 denotes a supply pipe for supplying air 86 to the cylinder 83. When the air 86 is supplied to the cylinder 83, the pressure within a cavity 87 is increased to thereby move the pressure foot 28 in a direction indicated by an arrow Z.

A vacuum generator 88 is used for sucking the air from the cavities 77. A plate-like member 89 is mounted on the lower surface of the pad 75. When compressed air 90 is supplied to the vacuum generator 88, a vacuum is generated and the gas within the gas suction passage 71, the annular passage 70 and the cavities 77 is drawn by the suction effect in directions indicated by the arrow A in FIG. 8. Under this condition, the plate-like member 89 is applied by being sucked by the vacuum pressure within the cavities 77, the annular passage 70 and the gas suction passage 71. Thus, the plate-like member 89 is mounted on the lower surface of the pad 75 mounted on the tip end of the pressure foot 28.

The cavities 77 are used for the purpose of sucking the plate-like member 89 with as wide an area as possible to thereby increase the suction force. A guide 91 is engaged with the outer portion of the plate-like member 89 for the purpose of preventing an offset or displacement of the plate-like member 89 even if some external force is applied to the member 89.

Also, for removing the cut chips generated during the boring work and for cooling the drill, the high pressure air (compressed air) is supplied at an adjusted flow rate to the supply port 73 by the flow rate adjustable type high pressure air supply device 82. The air is led through the gas supply passage 74 and the passage 79 to the nozzle 80 where the air is adiabatically expanded and its temperature is reduced at the annular passage 78. Further, the air is blown along the drill grooves from the air blow-out port 81 to the drill tip end as shown in FIG. 11, to thereby cool down the drill 3 and simultaneously remove the cut chips. The air within the pressure foot 28 is vacuum-sucked from the discharge port 38. As a result, the cut chips removed from the tip end of the drill 3 are led into the pressure foot 28 by the compressed air blown from the air blow-out ports 81 and are discharged from the discharge port 38 together with the compressed air blown from the air blow-out ports 81 into the pressure foot 28.

Reference numerals 92 and 93 denote O-rings for preventing the air leakage. Reference numeral 94' denotes holes worked in the printed circuit boards W. Numeral 16 denotes a lower plate for carrying the printed circuit boards W.

With such an arrangement, when a vacuum generating air 90 is fed to the vacuum generator 88, the air within the gas suction passage 71, the annular passage 70, and the cavities 77 is caused to flow in the direction indicated by the arrow A in FIG. 8 by the suction effect. Under this condition, the plate-like member 89 is applied by suction to the lower surface of the pad 75. Then, the interior of the pressure foot 28 is interrupted by the plate-like member 89 from the ambient air so as to be kept at a vacuum pressure therein. Accordingly, the compressed air supplied from the supply port 73 is led through the gas supply passage 74 and the passage 79 to the nozzle 80, where the air is adiabatically expanded and its temperature is reduced at the passage 78. Further, the air is blown from the air blow-out ports 81 through the drill tip end along the grooves of the drill 3 as shown in FIG. 11. As a result, the air is abruptly expanded in the air blow-out ports 81 and the pressure foot 28. Thus, when the compressed air is blown from the air blow-out ports 81 in a direction indicated by the arrow C, the air flow indicated by the arrows C, D and E in FIG. 9 in this order is generated to thereby perform the gas discharge through the discharge port 38.

Under this condition, when the spindle saddle is lowered, the plate-like member 89 sucked on the lower surface of the pad 75 is brought into contact with the uppermost printed circuit board W to thereby depress the printed circuit boards through the plate-like member 89.

Figure 9:
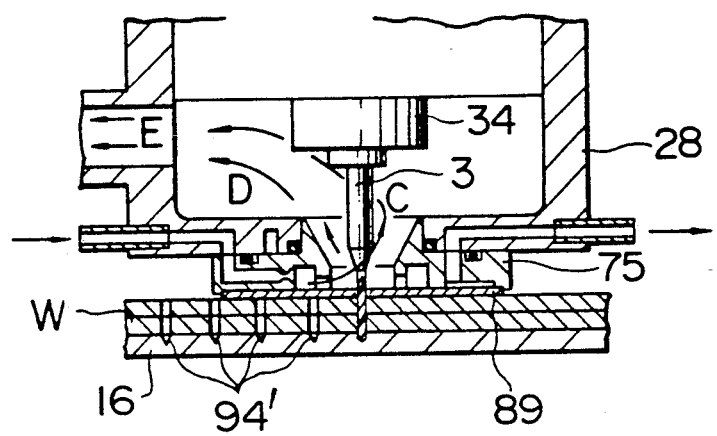
FIG. 9 is a view illustrating the operation of the pressure foot shown in FIG. 8.
Figure 10:
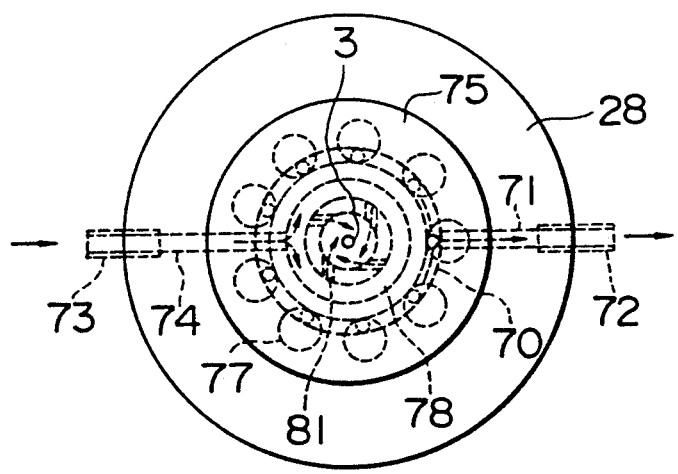
FIG. 10 is a bottom view showing the pressure foot shown in FIG. 8.

When the spindle saddle is further lowered, as shown in FIG. 9, the drill 3 is pushed into the printed circuit boards W, and the hole 94' is formed in the printed circuit boards W through the plate-like member 89.

When the spindle saddle is raised, then the drill 3 is pulled out from the printed circuit boards W and the plate-like member 89. At this time, since the air is caused to flow as indicated by the arrows C, D and E in FIG. 9, the chips clogging in the grooves of the drill 3 are discharged by the air flow C, D and E. Simultaneously, since the air whose temperature is reduced is brought into collision with the drill 3, the drill 3 can be effectively cooled down.

The hole 94 bored by the drill 3 in the plate-like member 89 serves as a guide for the drill 3 during the next boring work. Accordingly, it is possible to always press the vicinity of the worked portion of the printed circuit boards 95 under a constant state by using the plate-like member 89.

Figure 12:
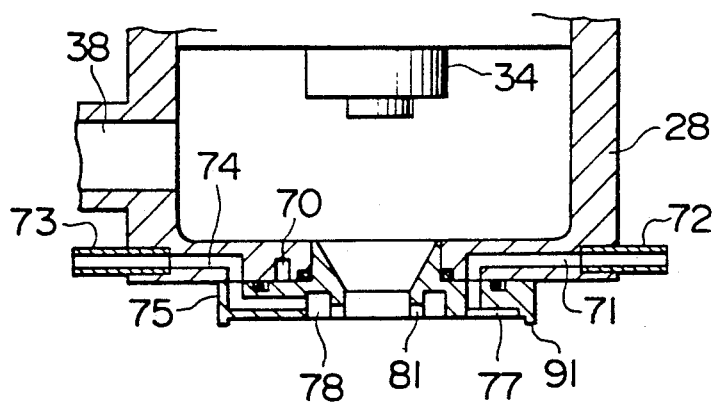
Figure 13:
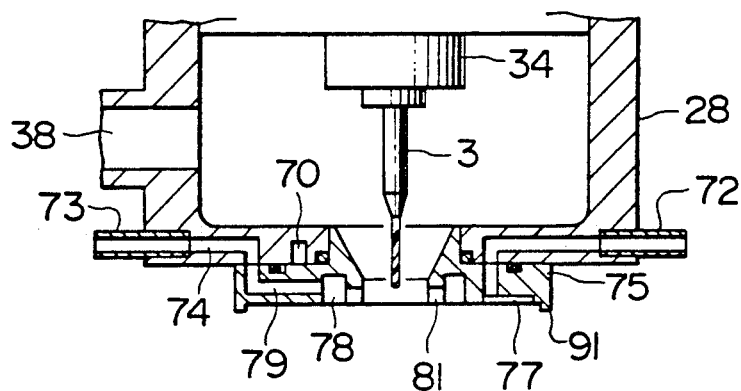
Figure 14:
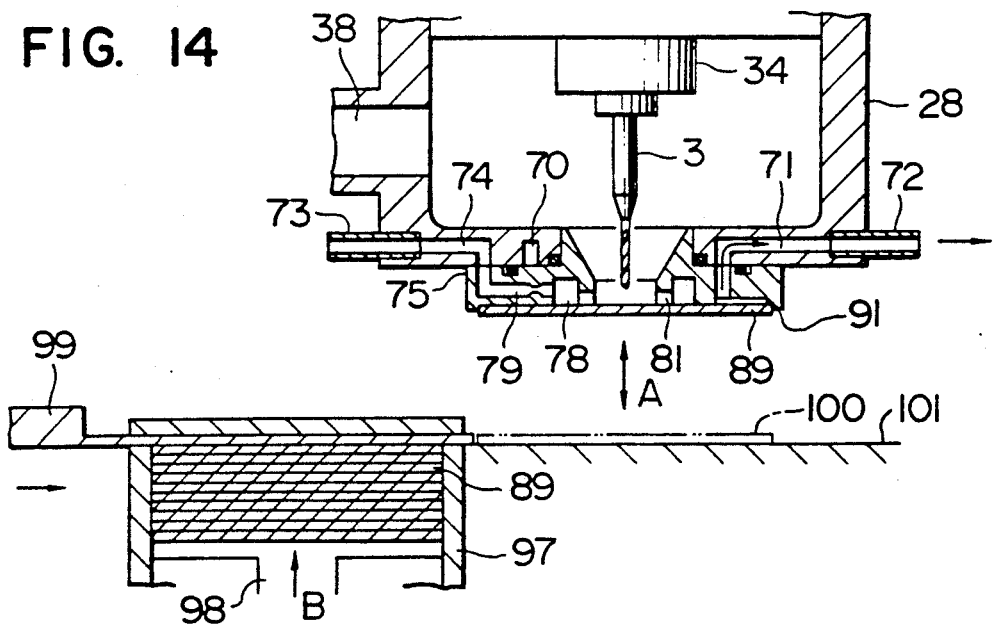

FIGS. 12 to 17 show a series of operations from the attachment/detachment of the drill 3 to the disposal of the plate-like member 89. More specifically, FIG. 12 shows a waiting state where the drill 3 is not chucked by the chuck 34. FIG. 13 shows a drill mounting state where the drill 3 is chucked by the chuck 34. Furthermore, FIG. 14 shows a plate-like member sucking state where the vacuum generator 88 is operated. The vacuum generating air 90 is fed to the vacuum generator 88 and the air within the gas suction passage 71, the annular passage 70 and the cavities 77 is sucked under the suction effect. The plate-like member 89 is applied to the lower surface of the pad 75 and sucked in place. Numeral 97 denotes a plate-like member stocker for receiving a plurality of plate-like members 89. Numeral 98 denotes a plate-like member pusher for pushing the members 89 upwardly in a direction indicated by the arrow B in FIG. 14. Numeral 99 denotes a plate-like member expelling device for expelling the plate-like member 89 from the stocker 97 and causing the member 89 to slide on a supply table 101 to a plate waiting position 100. The pressure foot 28 is moved in the Z-direction as indicated by the arrow A in FIG. 14 to thereby suck the plate-like member 89.

FIG. 15 shows a boring state after some boring operation were effected. The drill 3 is pushed into the printed circuit boards W guided by the hole 94 of the plate-like member 89.

FIG. 16 shows a plate disposing state where the spindle saddle is raised so that the drill 3 is pulled out from the printed circuit boards W and the member 89. The vacuum generation air 90 which is the compression air fed to the vacuum generator 88 is supplied to the cavities 77, resulting in a high pressure in the cavities 77, so that the plate-like member 89 applied to the lower surface of the pad 75 is removed and disposed. Reference numeral 102 denotes a disposal station for the used plate-like members 89.

Figure 17:
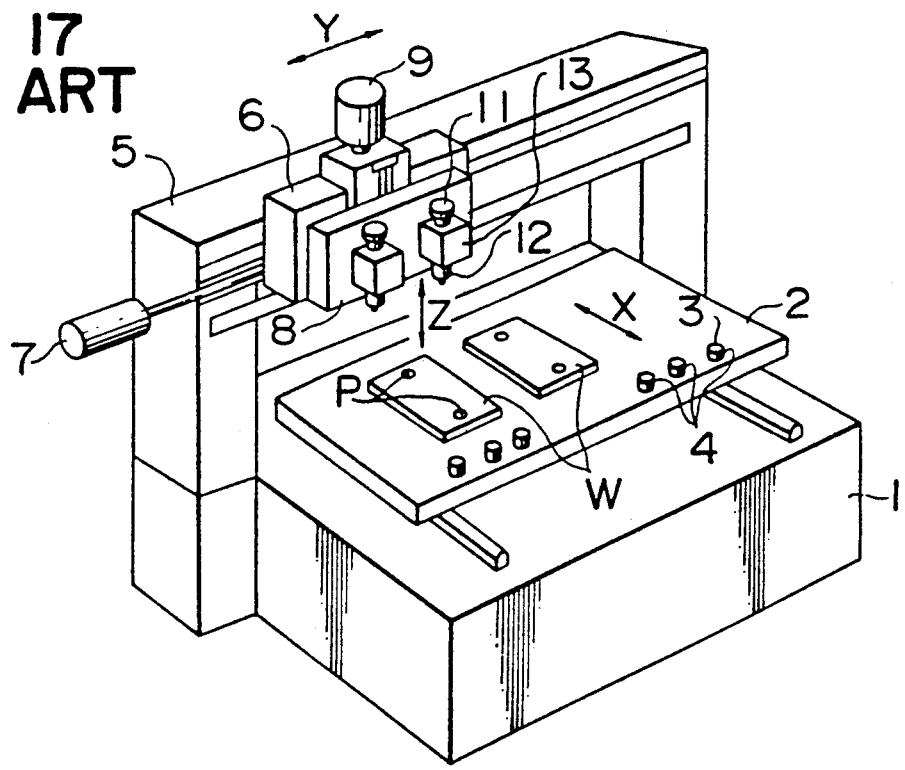
FIG. 17 is a perspective view showing a conventional printed circuit board boring machine.
Figure 18:
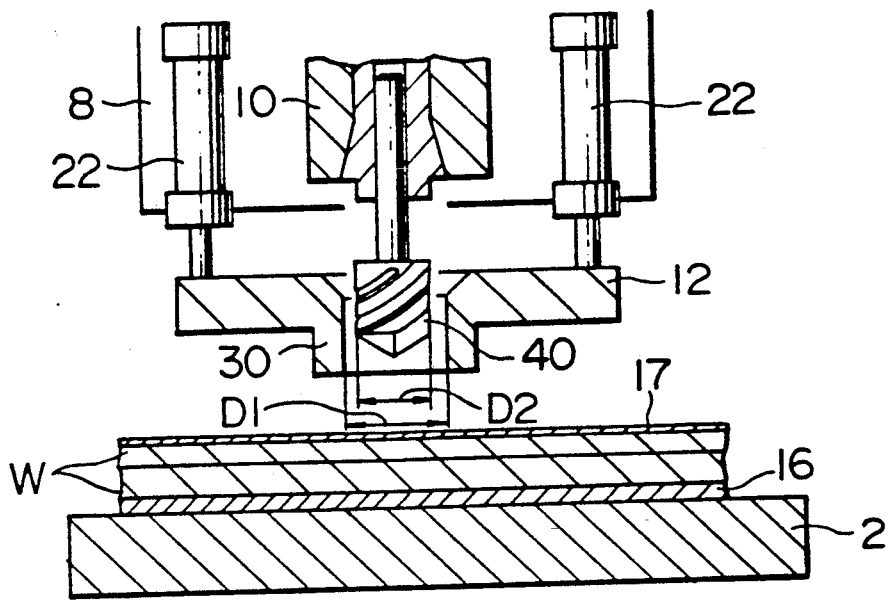
FIG. 18 a side sectional view showing a spindle portion of the conventional printed circuit board boring machine.
Figure 19:
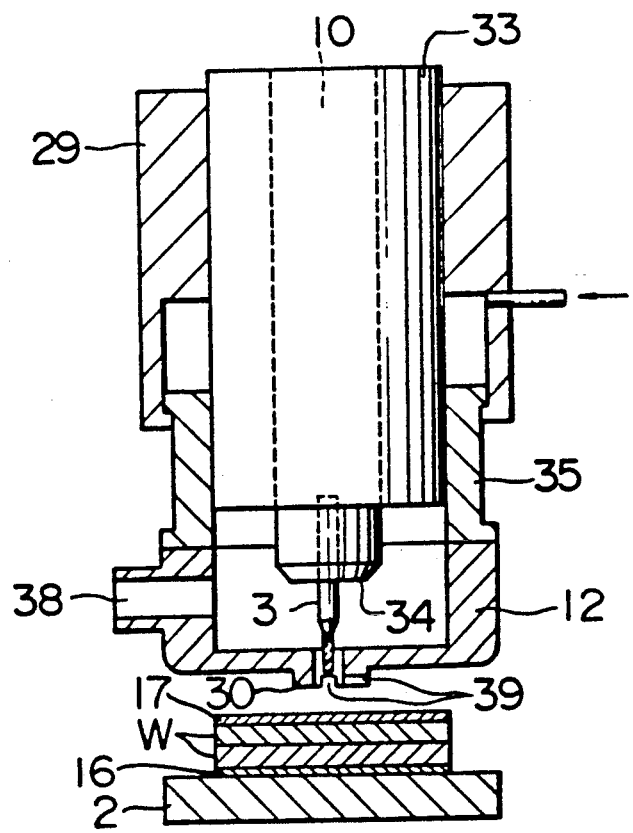
FIG. 19 is a side sectional view showing another spindle portion of a conventional printed circuit board boring machine.
Figure 20:
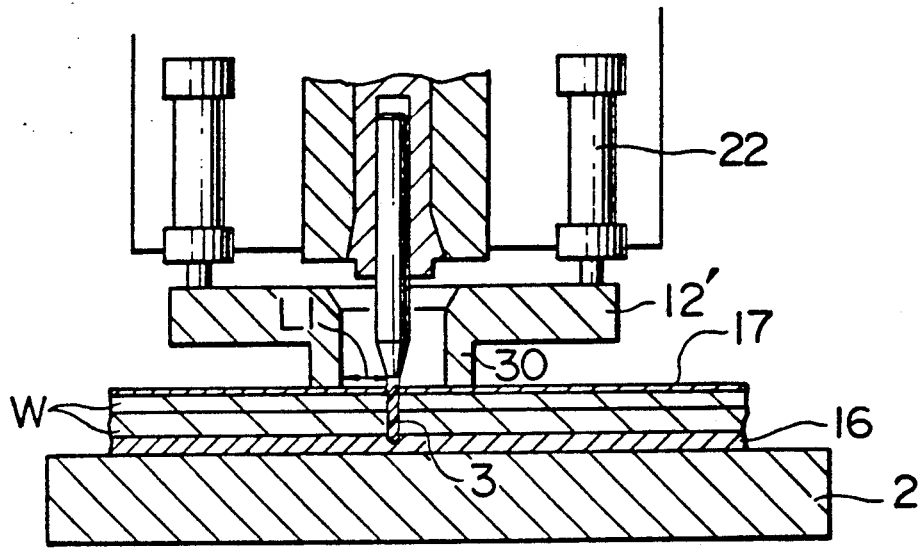
FIG. 20 is a side sectional view showing the board boring machine shown in FIG. 19 in operation.
Figure 21:
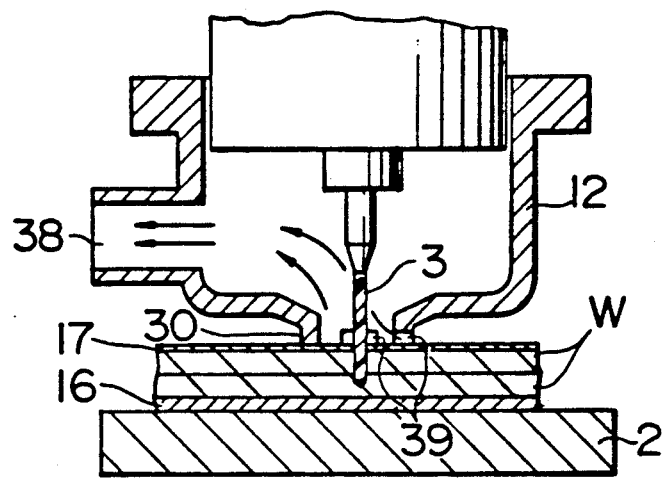
FIG. 21 is a side view showing the board boring machine shown in FIG. 20 in operation.

FIG. 17 shows a waiting state where the drill 3 is not chucked by the chuck 34 in the same manner as in FIG. 12.

Also, according to this embodiment, it is possible to ensure the boring quality equal to or higher than the conventional one within the conventional drill service life under the condition of the bore diameter of 0.2 mm or more.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A printed circuit board boring method, comprising the steps of:
    stacking printed circuit boards on a table;
    pressing the printed circuit boards with a pressure foot;
    supplying a plurality of pieces one by one for detachably mounting a piece on a tip end portion of the pressure foot, which piece is used for depressing the printed circuit boards in place;
    boring the printed circuit boards with a drill; and disposing of each used piece removed from the tip end portions of the pressure foot.

2. The method according to claim 1, further including the step of temporarily removing and locating the piece during drill replacement.

3. A printed circuit board boring method, comprising the steps of supporting a pressure foot to be slidable during a boring operation relative to a spindle with a drill;

selectively connecting a vacuum suction source with the pressure foot;

supplying air from a port formed in a side wall of the pressure foot to a pad having a plurality of blow-out ports for ejecting air toward an opening interior of the pressure foot and mounted at a tip end portion of the pressure foot; and detachably mounting a plate-like member on a contact surface of the pad with the printed circuit boards by a suction force of a plurality of air suction ports.

4. A printed circuit board boring machine for boring printed circuit boards stacked on a table by a drill while pressing the printed circuit boards with a pressure foot, comprising a piece for depressing said printed circuit boards in place detachably mounted on a tip end portion of said pressure foot, a piece receiving means for supplying a plurality of pieces one by one, and piece disposing means for disposing used pieces, said piece receiving means and said piece disposing means being mounted on said table.

5. The machine according to claim 4, wherein a piece temporary locating means for temporarily removing and locating the piece at drill replacement is provided on the table.

6. The machine according to claim 5, wherein said table on which said piece receiving means and said piece disposing means are provided is a table on which said printed circuit boards are laid.

7. A printed circuit board boring machine, comprising a table, a pressure foot, a drill operatively associated with the pressure foot for boring printed circuit boards stacked on the table while pressing the printed circuit boards with the pressure foot, and a piece having a hole through which the drill may pass being detachably mounted on a tip end portion of the pressure foot with a center of the hole being aligned with an axis of the drill, wherein the piece is magnetic material, and magnets are provided at a prescribed location of the tip and portion of the pressure foot, whereby the piece is held in place by a magnetic force of the magnets.

8. A printed circuit board boring machine for boring printed circuit boards by a pressure foot supported to be slidable in an axial direction of a spindle, connected to a vacuum suction source and adapted to depress the printed circuit boards during a boring operation, comprising a pad having a plurality of air blow-out ports for ejecting air, supplied from an air supply port formed in a side wall of said pressure foot, toward an opening interior of said pressure foot, an air supply passage connected to said air supply port and terminating at said plurality of air blow-out ports, a plurality of air suction ports formed in a contact face with the printed circuit boards to provide a suction force, and an air suction passage extending from said plurality of air suction ports to an air discharge port formed in the side wall of said pressure foot, said pad being mounted on a tip end portion of said pressure foot, and a plate-like member being detachably mounted on the contact surface of said pad with the printed circuit boards by the suction force of said plurality of air suction ports.

9. The machine according to claim 8, wherein said plurality of air blow-out ports for ejecting the air to the opening interior of said pressure foot is directed tangentially of the drill supported at the spindle.

10. The machine according to claim 8, wherein an orifice-like nozzle is formed within said air supply passage.

11. The machine according to claim 8, wherein guides having a depth smaller than a thickness of the plate-like member are provided on the contact face of the pad with the printed circuit boards.

* * * * *